United States Patent
Stueckelberger et al.

(10) Patent No.: US 11,461,939 B2
(45) Date of Patent: Oct. 4, 2022

(54) TOMOGRAPHIC METHOD OF DETERMINING A 3D MAP OF A CHARGE COLLECTION EFFICIENCY AND AN APPARATUS FOR PERFORMING THE METHOD

(71) Applicants: Arizona Board of Regents on behalf of Arizona State University, Scottsdale, AZ (US); Deutsches Elektronen-Synchrotron DESY, Hamburg (DE)

(72) Inventors: Michael E. Stueckelberger, Hamburg (DE); Xiaogang Yang, Hamburg (DE); Mariana I. Bertoni, Mesa, AZ (US)

(73) Assignees: Arizona Board of Regents on behalf of Arizona State University, Scottsdale, AZ (US); Deutsches Elektronen-Synchrotron DESY, Hamburg (DE)

( * ) Notice: Subject to any disclaimer, the term of this patent is extended or adjusted under 35 U.S.C. 154(b) by 0 days.

(21) Appl. No.: 17/533,921

(22) Filed: Nov. 23, 2021

(65) Prior Publication Data
US 2022/0172409 A1    Jun. 2, 2022

(30) Foreign Application Priority Data
Nov. 27, 2020    (EP) .................................... 20210322

(51) Int. Cl.
*G06K 9/00*    (2022.01)
*G06T 11/00*    (2006.01)
(Continued)

(52) U.S. Cl.
CPC .............. *G06T 11/003* (2013.01); *G06T 7/55* (2017.01); *G06T 15/04* (2013.01); *G06T 2211/416* (2013.01)

(58) Field of Classification Search
None
See application file for complete search history.

(56) References Cited

U.S. PATENT DOCUMENTS

| | | | |
|---|---|---|---|
| 8,704,176 B2* | 4/2014 | Boughorbel | H01J 37/261 250/311 |
| 2006/0128087 A1* | 6/2006 | Bamji | H01L 27/0805 257/E27.048 |

(Continued)

FOREIGN PATENT DOCUMENTS

| | | |
|---|---|---|
| DE | 3012162 A1 | 10/1981 |
| DE | 102010003095 A1 | 9/2011 |

OTHER PUBLICATIONS

European Patent Office Extended Search Report for Application No. 20210322.2 dated Apr. 29, 2021 (8 pages).
(Continued)

*Primary Examiner* — Guillermo M Rivera-Martinez
(74) *Attorney, Agent, or Firm* — Michael Best & Friedrich LLP

(57) ABSTRACT

A tomographic method of determining a 3D map of a charge collection efficiency in a charge carrier-separating sample. The method includes positioning the sample in a beam path, scanning the sample to measure the beam induced current and/or voltage for a plurality of locations, assigning a coordinate location for each of the plurality of locations, and applying a tomographic image reconstruction algorithm to generate a 3D map of the charge collection efficiency based on the assigned coordinate locations.

9 Claims, 2 Drawing Sheets

(51) Int. Cl.
*G06T 15/04* (2011.01)
*G06T 7/55* (2017.01)

(56) References Cited

U.S. PATENT DOCUMENTS

| | | | |
|---|---|---|---|
| 2009/0179161 A1* | 7/2009 | Ward | H01J 37/08 |
| | | | 250/424 |
| 2010/0276605 A1* | 11/2010 | Olsen | G01T 1/2928 |
| | | | 250/370.1 |
| 2013/0181312 A1* | 7/2013 | Hoenk | H01L 31/0216 |
| | | | 257/432 |
| 2016/0043260 A1* | 2/2016 | Nemanich | H01J 40/06 |
| | | | 136/255 |
| 2016/0315211 A1* | 10/2016 | Chandrashekhar | H01L 31/028 |
| 2017/0110616 A1* | 4/2017 | Dissanayake | H01L 51/0046 |
| 2017/0294291 A1* | 10/2017 | Saleh | H01J 37/32825 |
| 2018/0176492 A1* | 6/2018 | Bamji | G01S 7/481 |
| 2019/0140181 A1* | 5/2019 | Huang | H01L 51/4246 |
| 2020/0357833 A1* | 11/2020 | Meylan | H01L 27/14687 |

OTHER PUBLICATIONS

Ossig et al., "X-ray Beam Induced Current Measurements for Multi-Modal X-ray Microscopy of Solar Cells," Journal of Visualized Experiments, No. 150, e60001, (2019).
Stuckelberger et al., "Latest developments in the x-ray based characterization of thin-film solar cells", 2015 IEEE 42nd Photovoltaic Specialist Conference (PVSC), IEEE, 2015, pp. 1-6.
Leamy, "Charge collection scanning electron microscopy,"Journal of Applied Physics, vol. 53, No. 6, (1982).

* cited by examiner

TOMOGRAPHIC METHOD OF DETERMINING A 3D MAP OF A CHARGE COLLECTION EFFICIENCY AND AN APPARATUS FOR PERFORMING THE METHOD

TECHNICAL FIELD

The invention relates to a tomographic method of determining a 3D map of a charge collection efficiency in a volume of investigation of a sample, in which the sample has a charge carrier selecting structure. Furthermore, the invention relates to an apparatus of determining a 3D map of a charge collection efficiency in a volume of investigation of a sample having a charge carrier selecting structure.

BACKGROUND ART

In an electronic device, which is manufactured in that it comprises a charge carrier-selecting structure, which is for example a p-n junction in a solar cell or in an X-ray detector, it is important to know how efficiently charge carriers (electrons or holes) can be collected. In a solar cell, for example, the charge carriers are collected via the electric contacts of the solar cell. The generation of charge carriers in the charge carrier-selecting structure can in principle be characterized by a measurement of a current and/or voltage, which is generated by the solar cell.

The spatially resolved charge collection efficiency, however, depends on the particular location in the device, which is exposed to radiation. In other words, in a situation in which a small beam is scanned over the surface of for example, a solar cell, the current and/or voltage, which is produced by the solar cell, varies with the varying point of incidence of the beam. Such a measurement of the charge collection efficiency with spatial resolution is a very interesting parameter for evaluation of the electrical performance of, for example, the solar cell. The local performance can vary due to local defects, which means that the device shows a reduced charge collection efficiency in the area of or nearby defects in the microstructure of the charge carrier selecting structure. It is therefore of vital interest to map the charge collection efficiency with spatial resolution. It is always a goal to provide a testing method or test device for locally examining the charge carrier-separating sample.

One approach to this question is known from document DE 30 12 162 A1. A solar cell is exposed to a small light spot, which is scanned over the surface of the solar cell line by line. At the same time, the voltage and/or current output of the solar cell is measured. Thereby, for each position of the light spot, a corresponding value for the voltage and/or current output can be determined. This approach can be used to detect local damage of the solar cell.

Document DE 10 2010 003 095 A1 discloses a more enhanced method for the testing of solar cells for possible damage. An electrical quantity of the solar cell, for example the current and/or voltage, is recorded and evaluated during scanning of the solar cell with a linear light source. A 2D-map showing the charge collection efficiency is subsequently provided.

The measurements of the charge collection efficiency can be performed using different radiation sources. Examples are measurements of a laser beam induced current (LBIC), an electron beam induced current (EBIC), an ion beam induced current (IBIC) or an X-ray beam induced current (XBIC). The basic principle remains the same and analog techniques exist for voltage measurements. The laser beam, the electron beam, the ion beam or the X-ray beam are scanned over the surface of the device under test while at the same time the signal of the device, for example, the voltage, the current or the power of the solar cell is measured.

Technical Problem

It is an object of the invention to provide an enhanced method of determining a charge collection efficiency and an enhanced apparatus for determining a charge collection efficiency allowing a more detailed determination of a charge collection efficiency in a charge carrier-separating sample.

SUMMARY OF THE INVENTION

The object is solved by a tomographic method of determining a 3D map of a charge collection efficiency in a volume of investigation of a sample, in which the sample has a charge carrier selecting structure, the method comprising the steps of:

Arranging the sample in a beam path of a probe beam, wherein the probe beam propagates in a beam-direction which defines an axis in a laboratory frame coordinate system, Scanning the volume of investigation with an analyzing spot of the probe beam and simultaneously measuring the beam induced current and/or voltage, wherein a position of the sample arranged on a sample stage is defined by coordinates z, y and r and a value of the beam induced current and/or voltage is determined for every position of the sample during the scanning action and Assigning every coordinate point in the laboratory frame coordinate system, at which the analyzing spot of the probe beam hits the sample to a value of the beam induced current and/or voltage, which is measured for this point, Reconstructing the 3D map of the charge collection efficiency by processing the values of the beam induced current and/or voltage determined for the coordinates in the laboratory frame coordinate system with a tomographic image reconstruction algorithm so as to determine the 3D map of the charge collection efficiency in a coordinate system of the sample.

The 3D map of the charge collection efficiency enables a user an in-depth analysis of the performance of the device under test. Conventional 2D measurements do not provide any depth information.

For the first time, the method according to aspects of the invention provides a 3D tomographic reconstruction of the charge collection efficiency based on measurements of the beam induced current and/or voltage. The depth information can be used for a more detailed analysis of the device under test.

The analyzing spot of the probe beam can be realized in different ways. For example, the analyzing beam can be an X-ray beam and the analyzing spot of the X-ray beam can be the entire cross-section of the X-ray beam that is chosen to be smaller than the sample. Such an X-ray beam profile results, for example, from focusing using Fresnell zone plates. The analyzing spot of the X-ray beam can however also be a maximum of the intensity in the X-ray beam cross-section. In this cross-sectional area, the X-ray beam shows significantly more intensity in comparison to the remaining part/area of the beam cross-section. According to further option, an aperture comprising a through hole can be placed in the X-ray beam. The aperture allows the X-ray beam to pass only in the small fraction of the through hole while the remaining part of the beam cross-section is blocked. It is then possible to provide the analyzing spot of the X-ray beam.

The above description relative to the analyzing spot of the X-ray probe beam applies to probe beams having other radiation sources in a same or similar way. The described examples for an analyzing spot are not exhaustive, which means that further designs for the analyzing spot can be realized according to further embodiments of the invention. In general, any design providing a probe beam having an internal structure is suitable. For example not only the aperture may be scanned in addition to the sample, but also the X-ray focusing optics which provide a similar effect as lenses in classical optics, can be scanned.

According to a further advantageous aspect of the invention, the tomographic method is further enhanced in that
the step of Scanning includes: scanning the sample by performing a translational movement between the sample and the probe beam while keeping a spatial configuration between the sample and the beam-direction, and the method further includes
Determining a 2D-map of the beam induced current and/or voltage by assigning a respective one of the values of the measured beam induced current and/or voltage to the corresponding position, at which the beam induced current and/or voltage is measured,
Changing the spatial configuration between the sample and the beam-direction by performing a rotational movement and repeating the steps of Scanning and Determining of the 2D-map for a plurality of different spatial configurations,
Reconstructing the 3D map of the charge collection efficiency by processing the set of 2D-maps with a tomographic image reconstruction algorithm.

According to this advantageous aspect of the invention, the 3D map of the charge collection efficiency is reconstructed using the tomographic image reconstruction algorithm to which 2D-maps are input. This particular type of reconstruction is very convenient since many algorithms for a reconstruction from 2D-maps are available, which can be applied with only little adaption necessary.

In still another advantageous aspect of the invention, the step of Reconstructing further includes the step of additionally including at least one parameter of a material of the sample when reconstructing the 3D map of the charge collection efficiency from the set of 2D-maps. The parameter of the material is for example a material density. By taking into account such a parameter of the material, the reconstruction of the 3D map of the charge collection efficiency from the set of 2D-maps is further enhanced.

In another advantageous embodiment of the invention, the tomographic method further comprises the steps of:
Electrically contacting the sample to allow a measurement of the beam induced current and/or voltage,
Arranging the sample on a sample stage, wherein the beam-direction defines an x-direction of the laboratory frame coordinate system and the sample stage is configured to provide the translational movement of the sample in a z-direction and a y-direction of the laboratory frame coordinate system and the sample stage is configured to provide a rotational movement of the sample about a sample stage rotation axis,
Scanning the volume of investigation in that the sample stage performs a translational movement of the sample in the z-direction and the y-direction of the laboratory frame coordinate system.

The tomographic method can be further enhanced in that the sample stage performs the rotational movement by rotating the sample about the sample stage rotation axis.

Basically, the scanning action can be performed by scanning the probe beam while the sample is at rest. According to the above-referred embodiment, the sample is scanned while the beam is fixed. Naturally, both movements can be combined, which means that the scanning action can be performed by moving both, the beam and the sample.

Summarizing, it does not matter in general, whether the sample or the probe beam moves. However, it is critical that there is a relative scan motion between the sample and the probe beam in three directions, i.e. two translations (referred to as "trans1" and "trans2" in the following) and one rotation (referred to as "rot" in the following). The motions can be split between a movement of the sample and the probe beam in any possible way. The following list gives an overview about possible combinations of the movements:
a. sample: trans1 & trans2 & rot; probe beam is fix
b. sample: trans1 & trans2; probe beam: rot
c. sample: trans1 & rot; probe beam: trans2
d. sample: trans1; probe beam: trans2 & rot
e. sample: trans2; probe beam: trans1 & rot
f. sample: trans2 & rot; probe beam: trans1
g. sample: rot; probe beam: trans1 & trans2
h. sample is fix; probe beam: trans1 & trans2 & rot According to example a., the sample is moved along two axes (translational movement), for example by a sample stage, and it is rotated using for example a rotation table. In example h., the sample is fix and only the probe beam is scanned along two axes and the beam (including the beam source in an example) is rotated around the sample. The examples b. to g. are mixed forms of these two concepts.

The laboratory frame xyz-coordinate system can be a right handed coordinate system, for example a right handed Cartesian coordinate system. However, any other definition of a coordinate system is applicable. By way of an example, the laboratory frame coordinate system is fixed relative to the orientation of the X-ray beam. In particular, the laboratory frame xyz-coordinate system does not rotate with a rotation stage of the sample stage. A position of the sample stage is defined by the coordinates z, y and r. Hence, the position is characterized by the triple referred to as (z, y, r).

During the measurement, a scanning action along the z- and y-coordinate is performed. Furthermore, the sample is rotated about the sample stage rotation axis. In other words, every position of the sample stage can be characterized by the coordinate triple (z, y, r). This Triplett is supplemented by the measured X-ray beam induced current and/or voltage. The value of the current and/or voltage shall be referred to as A/V. The resulting data set for every position of the sample stage is (z, y, r, A/V). A large number of these data sets is collected during the described scanning action. Subsequently, by help of the tomographic image reconstruction algorithm, the charge collection efficiency is calculated from these data sets (z, y, r, A/V) in a coordinate system of the sample, which can be represented by the coordinate data set (x*, y*, z*, CCE), wherein CCE stands for the charge collection efficiency. The direction of the x*-, y*-, and z*-axis in this coordinate system can for example be aligned to the macroscopic dimensions of the sample. For example the z*-direction stands perpendicular on the sample surface, which means parallel to the surface normal of the sample.

According to a further development of the set-up, the scanning action of the sample stage carrying the probe can be replaced by a scanning action of a further stage carrying the aperture. By the scanning movement of this further stage, the z- and y-coordinates, which are normally scanned using the sample stage, can also be scanned using the aperture. This scanning action is performed using for example a further sample stage, which carries the aperture.

According to an advantageous aspect of the invention, the tomographic method further comprising the steps of:
Measuring the beam induced current and/or voltage and an additional measurement modality when scanning the volume of investigation,
Correcting a measurement value for the beam induced current and/or voltage using a measurement value of the additional measurement modality, which is determined, in a combined analysis, wherein the additional measurement modality is one or more item selected from the following list:
fluorescence, transmittance, reflectance, scattering, diffraction, excited optical luminescence, coherent diffraction imaging The measurement of the beam induced current and/or voltage and the additional measurement modality can be performed simultaneously, when scanning the volume of investigation.

The beam induced current and/or voltage, which can be directly measured at the sample, is—in a first approach—a parametrization of the three dimensional absorption coefficient, the charge collection efficiency and the beam intensity. To be more precise, the beam induced current and/or voltage (in addition to the named parameters) is depending on further parameters, which are for example the instrumentation such as the current amplifiers and the beam intensity measurement equipment. All this impacts the beam induced current and/or voltage measurement as well. This should, however, not be discussed here. The charge collection efficiency, which is the parameter of interest, can be reconstructed from the measurement of the beam induced current using a measurement of the absorptance, fluorescence, transmittance, reflectance, scattering, diffraction, excited optical luminescence and/or coherent diffraction imaging while at the same time measuring the beam intensity. Advantageously, a quantitative analysis of the charge collection efficiency can be performed when a simultaneous measurement of one or more of the above parameters is performed. The mentioned measuring methods can be used to correct beam induced current and/or voltage. In another aspect of the invention, they can be performed as additional independent measurements and thus provide additional data that are helpful for the overall analysis of the sample.

In still another advantageous aspect of the invention, the tomographic method can be further enhanced in that the probe beam is an X-ray beam, an ion beam, an electron beam or a laser beam.

It has proven to be advantageous to reconstruct the 3D map from measurements of the X-ray induced current, although the other mentioned radiation sources, for example lasers, are available and provide suitable results. X-rays offer various advantages. One of the advantages is that X-ray beams deviate less from the straight beam direction compared to, for example, laser beams, due to the refractive index being close to 1. The reconstruction of the charge collection efficiency from laser-beam induced current and/or voltage measurements need more care because it can suffers from uncertainties, as the beam path inside the device under test is less precisely known than in the case of X-ray beam induced current measurements. This is one reason why the generation of a 3D map based on X-ray induced current measurements can be advantageous.

As for X-rays, the ion beams and electron beams should have a structure, which is in the order of magnitude that should be the resolution of the measurement. In the simplest embodiment, this is achieved using a focused beam. More details have been mentioned above with respect to the analyzing spot of the X-ray beam. All the aspects mentioned with respect to the analyzing spot of the X-ray beam in these paragraphs apply in a same or similar way to the ion beams and electron beams and laser beams.

The type of probe beam can be selected for example depending on the desired penetration depth, that can be varied by the type of ion and the energy of the ion and electron beam.

According to further embodiments of the invention, the probe beam is
a. a laser beam having a wavelength between 100 nm and 3000 nm, in particular between 120 nm and 1500 nm, further in particular between 500 nm and 1300 nm,
b. an electron beam having an energy between 1 keV and 300 keV, in particular between 10 keV and 200 keV, further in particular between 50 keV and 150 keV,
c. an ion beam having an energy between 100 eV and 100 MeV, wherein in particular H-ions, Ar-ions and/or He-ions are applied,
d. an X-ray beam having an energy between 1 keV and 300 keV, in particular between 4 keV and 100 keV.

According to another advantageous aspect of the invention, the sample is a semiconductor device, a solar cell, a photon detector, an X-ray detector or a CCD-device and the charge collection efficiency is determined by measuring an output current and/or an output voltage of the solar cell, of the device or of the detector as the beam induced current and/or voltage.

A measurement of a 3D map of the charge collection efficiency is of high commercial interest for solar cells. This is because local defects in the microstructure of the solar cell can significantly deteriorate their performance. A 3D map provides very valuable information and answers the question in which part of the volume of the solar cell, the material shows an underperformance. Further developments and enhancements of solar cell and the production process thereof can subsequently focus on this particular volume of the sample.

According to another aspect of the invention, the charge carrier separating sample is an X-ray detector, for example photon counting detector or a flat panel X-ray detector. A detailed analysis of the charge collection efficiency can be used to calibrate such an X-ray detector. This enhances the sensitivity and thereby the performance of the detector.

According to a further advantageous aspect, the method is further enhanced in that it includes the step of applying a variable bias voltage on the sample, wherein the bias voltage is changed during the step of Scanning.

The bias voltage can basically be applied at different places. For example, the bias voltage can be applied via the electrical contacts at which the beam induced current is measured (two-point measurement). It is also possible to place two additional contacts on the sample for a more precise measurement (four-point measurement). The contacts for application of the bias voltage can also be placed at an arbitrary other position, e.g. for the measurement of more complex electronic circuits.

Furthermore, the object is solved by an apparatus for determining a 3D map of a charge collection efficiency in a volume of investigation of a charge carrier-separating sample, said apparatus being configured to perform the method according to aspects of the invention.

The apparatus offers same or similar advantages, which have been mentioned with respect to the method according to aspects of the invention and which shall not repeated.

Further characteristics of the invention will become apparent from the description of the embodiments according to the invention together with the claims and the included drawings. Embodiments according to the invention can fulfill individual characteristics or a combination of several characteristics.

BRIEF DESCRIPTION OF DRAWINGS

The invention is described below, without restricting the general intent of the invention, based on exemplary embodiments, wherein reference is made expressly to the drawings with regard to the disclosure of all details according to the invention that are not explained in greater detail in the text. The drawings show in.

In the drawings, the same or similar types of elements or respectively corresponding parts are provided with the same reference numbers in order to prevent the item from needing to be reintroduced.

DESCRIPTION OF EMBODIMENTS

Figure 1:
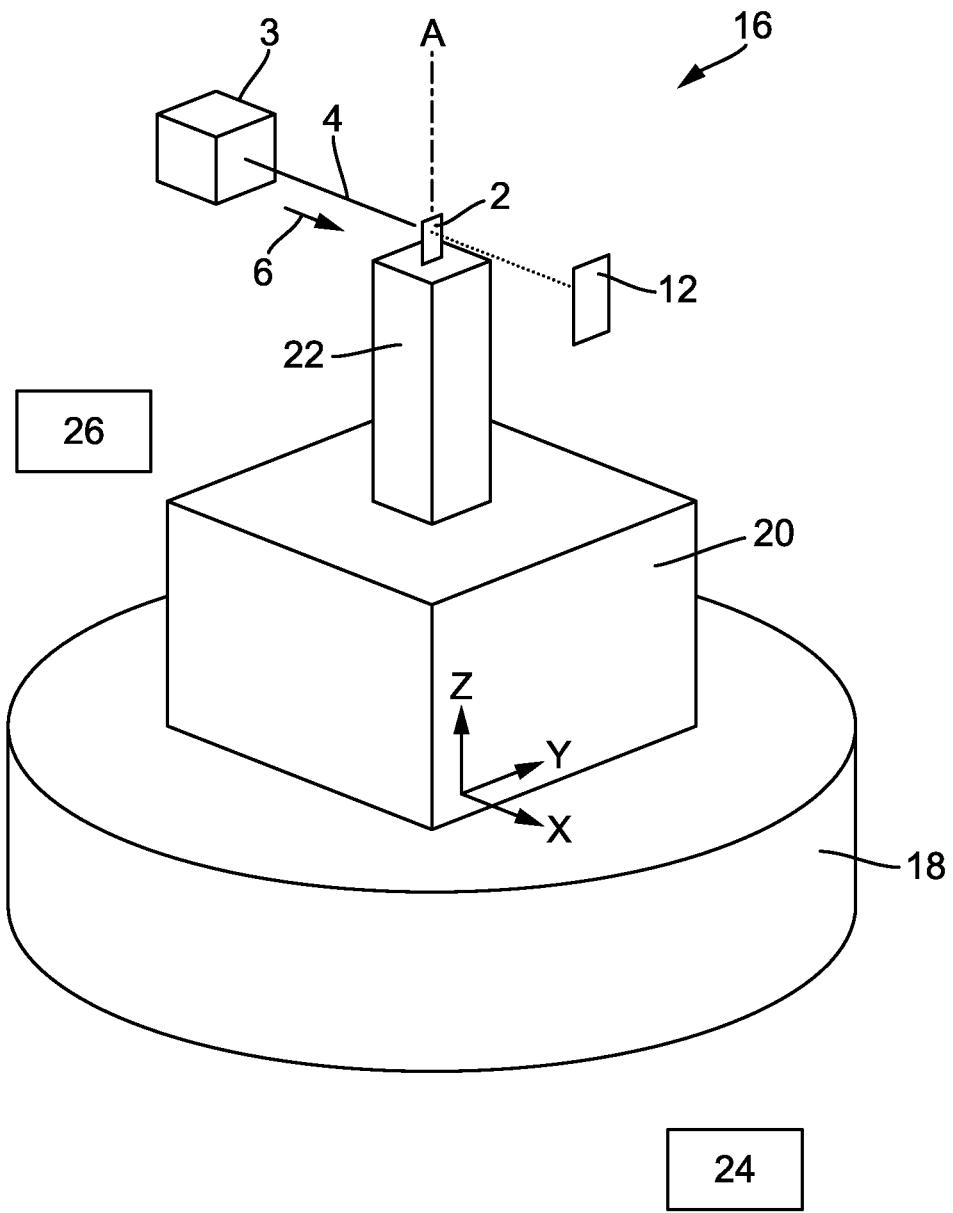
FIG. 1 a simplified perspective view on an apparatus for determining 3D map of a charge collection efficiency, FIG. 2 a simplified perspective view on a sample or on a device under test, which can be for example a solar cell.

FIG. 1 shows a simplified perspective view on an apparatus 16 for determining a 3D map of a charge collection efficiency. The apparatus 16 comprises a sample holder 22 holding a sample 2. The sample 2 is for example a solar cell or another device under test, which comprises a charge carrier selecting structure. The sample holder 22 is mounted on a sample stage 20, which is for example configured to provide a movement of the sample holder 22 in all three spatial axes x, y and z. Furthermore, the sample stage 20 is for example mounted on a rotation table 18. The rotation table 18 is for rotating the sample stage 20 together with all units mounted thereon about a sample stage rotation axis A, which is vertical by way of an example only. The sample stage 20 can be either arranged on top of the rotation table 18, or underneath. If the sample stage 20, i. e. the translation stage, is arranged underneath the rotation table 18, it is not necessary to provide a stage capable of translational movement in all three spatial directions, which means along the directions x, y and z in FIG. 1. For example, the x-direction can be dispensed with, because it is not needed due to the fact the rotation table 18 in its entirety is movable along the y and z-direction. Only if the translation stage is mounted on top of the rotation table 18, translational movement along all three spatial axis x, y and z is required.

The depicted example refers to a measurement setup in which the sample 2 is moved relative to a fixed probe beam 4. In other embodiments, the probe beam 4 is moved while the sample 2 is kept fix. These two concepts can also be mixed, for example, the beam 4 can perform a scanning action and the sample only undergoes a rotation by the rotation table 18.

The probe beam can an X-ray beam, an ion beam, an electron beam or a laser beam. By way of an example only, reference is made mainly to an X-ray beam representing the probe beam 4 in the following.

The apparatus 16 further comprises a detector 12, which is for example an X-ray detector and further for example an area detector. The detector 12 is mounted on a suitable holder, which is not shown for the sake of clarity of the figure. Furthermore, the apparatus 16 comprises a measurement unit 26, which is configured to measure a beam induced current A and/or the beam induced voltage V at the sample 2. The measurement unit 26 is electrically connected to the sample 2. The wiring is not shown for the sake of clarity of the figure only. Further details will be explained when making reference to FIG. 2.

The apparatus 16 further comprises a processing unit 24, which is a computer, a workstation or any other suitable computational device. The processing unit 24 is configured to control the rotation table 18 and the sample stage 20. Furthermore, the processing unit 24 is configured to process data, which is acquired by the measurement unit 26 and the detector 12 and a flux detector 3, which is arranged in the beam path of the probe beam 4. For example, the flux detector 3 is an X-ray flux detector. The measurement unit 26 and the processing unit 24 can be arranged at any suitable place of the apparatus 16. Electrical interconnects and data lines are not shown for the sake of clarity of the figure only.

Figure 2:
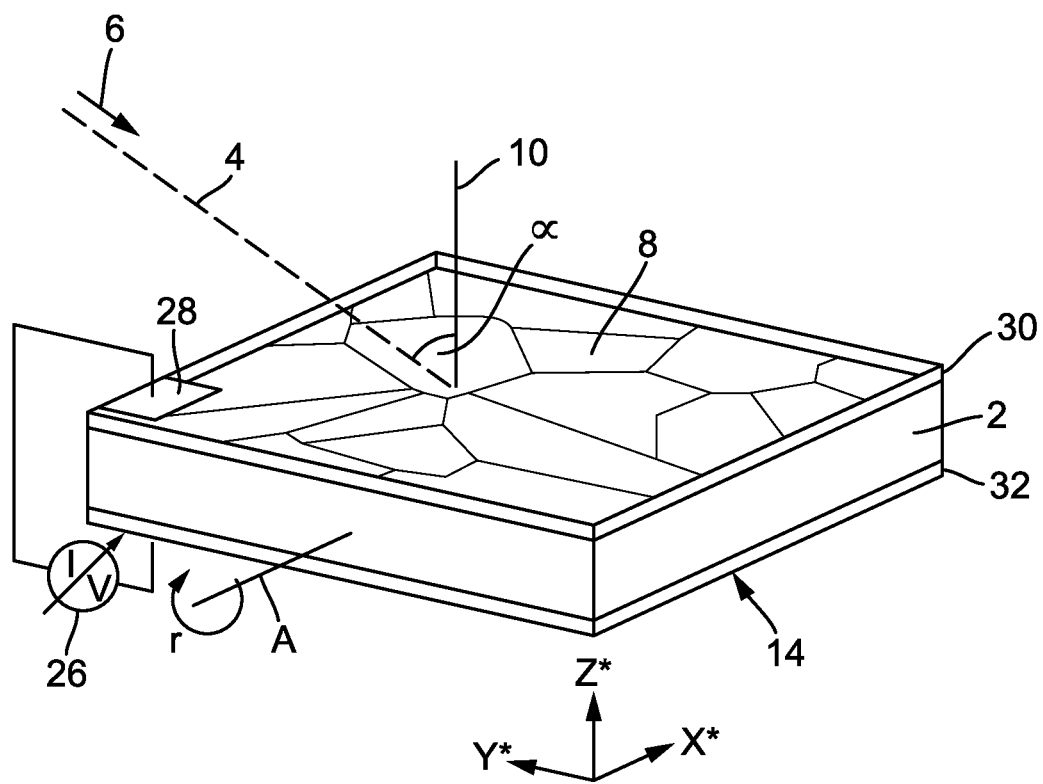

FIG. 2 is a simplified perspective view on a sample 2, which is a solar cell, by way of an example only. The sample 2 has a polycrystalline microstructure and is manufactured for example from silicon. Silicon is only an example for a material, which can serve as a basis for manufacturing a charge carrier selecting structure. The sample 2 can be manufactured from any other material showing a charge carrier separating effect. The single grains of the polycrystalline microstructure are indicated by separating lines. Also monocrystalline or noncrystalline samples 2 can be analyzed. On the top surface 8 and on the bottom surface 14, the silicon is coated with an electrically conductive material. For example, a layer of ITO (Indium Tin Oxide) is applied. ITO is transparent for light and electrically conductive. Furthermore, the bottom layer 32 can be aluminum instead of ITO and the front contact can be not a layer but a number of silver stripes used for contacting the silicon. The beam induced current I and/or the beam induced voltage V is measured using the measurement unit 26. Contact pads 28 electrically contact the top layer 30 and the bottom layer 32, respectively. A variable bias voltage can be applied on the sample 2, wherein the bias voltage can be changed during the step of scanning. The bias voltage can be applied via the contact pads 28, for example.

The apparatus 16 is configured to determine a 3D map of the charge collection efficiency of the sample 2. The 3D map is generated for a volume of investigation. If the probe 2 is for example a solar cell device, the volume of investigation can be that part or volume of the device, which represents the active photovoltaic material. In other words, the periphery of the device such as wiring, a holding frame and the like, will not be tested. The processing unit 24 is configured to perform a testing method, which will be outlined below:

Firstly, the sample 2 is electrically contacted. For example, a solar module to be tested is connected to the measurement unit 26. For the sample 2 shown in FIG. 2, the step of electrically contacting includes the deposition of the contact pads 28, if necessary. Suitable wiring are applied to allow a measurement of the beam induced current I and/or the beam induced voltage V. Subsequently, the sample 2 is arranged in the beam path of the beam 4. The probe beam 4 propagate in a beam-direction 6. The probe beam can have various sources. For X-rays, this ranges from table top X-ray sources to a synchrotron radiation source. It is advantageous to use a beam source, which emits a probe beam 4 having a small cross-section.

The smaller the beam cross-section the higher the spatial resolution of the measurement. Laboratory X-ray sources offer a typical beam cross-section of 20 μm while synchrotron sources can range down to a beam cross-section of 20 nm. In all cases, the X-ray beam 4 should have a beam cross-section that is small compared to a size of the surface 8 exposed to radiation. This is to allow a measurement with spatial resolution. For example, the cross-section of the X-ray beam 4 is smaller by a factor of at least ten, in particular by a factor of 100, further in particular by a factor of 1000, compared to a size of the surface 8.

The surface 8, which is exposed to the radiation of the probe beam 4, includes an angle of incidence a with the beam-direction 6. The measurement can start with angle of incidence a identical to zero, which means normal incidence of the beam. The angle of incidence a may be changed during the measurement, upon rotation of the sample 2 about the sample stage rotation axis A. The angle of incidence α is the angle included by the surface normal 10 and the beam-direction 6. This is, however, nor required. For example, in XBIC-lamino-graphy, which is a special case of XBIC tomography, the angle of incidence a does not change during the measurement. For such a measurement, the rotation axis A is typically chosen to be aligned with the surface normal 10 and the angle of incidence a is kept constant for the entire 3D measurement when scanning the coordinates y, z and r.

Now, a fraction of the volume of investigation is exposed to the probe beam 4. Simultaneously, the beam induced current I and/or voltage V is measured.

According to one embodiment of the invention, a scanning action is performed by the sample stage 20. It should be mentioned that this is the most common option only. It is also possible to scan the probe beam 4 for example by scanning the beam optics, which is not shown in the figure. This is performed using a further translational stage. In the embodiment of FIG. 1, showing normal incidence, the scanning is in the x-z-plane. By help of the scanning action, different fractions of the volume of investigation are systematically exposed to the probe beam 4 and for each spot, the simultaneously measured beam induced current I and/or voltage V is determined.

Every position of the sample stage 20 can be characterized by the coordinate triple (z, y, r). This Triplett is supplemented by the measured X-ray beam induced current A and/or voltage V. The value of the current A and/or voltage V shall be referred to as A/V. The resulting data set for every position of the sample stage 20 is (z, y, r, A/V). A large number of these data sets is collected during the described scanning action.

Subsequently, by help of a tomographic image reconstruction algorithm, the charge collection efficiency is calculated from these data sets (z, y, r, A/V) in a coordinate system of the sample 2, which is represented by the coordinate system indicated by the axis named x*, y* and z*. This results in a data set (x*, y*, z*, CCE), wherein CCE stands for the charge collection efficiency. The direction of the x*-, y*-, and z*-axis in this coordinate system can for example be aligned to the macroscopic dimensions of the sample 2, which means along the edges of the sample 2. By way of an example only, the z*-direction stands perpendicular on the sample surface, which means parallel to the surface normal 10 of the sample 2.

The result of scanning action along the x- and z-axis of the sample stage 20 is a map of the charge collection efficiency of the sample 2 in the volume of investigation. In particular, this 2D-map is determined by assigning information on a position at which the probe beam 4 hits the exposed fractions and the measured beam induced current I and/or voltage V at said position.

When this part of the measurement is finished, the step of scanning the volume of investigation is repeated for a plurality of different angles, which means for a number of different angles r of rotation about the sample stage rotation axis A. The result of this is a set of 2D-maps, each being assigned to a different angle of rotation r. Subsequently, a 3D map of the charge collection efficiency is reconstructed by processing the set of 2D-maps with a tomographic image reconstruction algorithm.

According to an embodiment of the invention, the processing unit 24 is further configured to perform the following steps in addition. A simultaneous measurement of the beam induced current I and/or voltage V and a measurement of an absorptance is performed when scanning the volume of investigation. Furthermore, for example, the X-ray beam induced current I and/or voltage V can be measured while a simultaneous measurement of one or more of the following parameters is performed a. X-ray fluorescence,
b. X-ray transmittance,
c. X-ray reflectance,
d. X-ray scattering,
e. X-ray diffraction,
f. X-ray excited optical luminescence,
g. Coherent diffraction imaging.

Analogous techniques can also be used for the other probe beams (ion beam, electron beam, laser beam) together with the respective beam induced current and/or voltage measurements.

The measuring methods listed above can be used to correct the beam induced current and/or voltage. On the other hand, they can be performed as additional independent measurements to provide additional data that can be helpful for the overall analysis of the sample 2.

The absorptance is measured using the detector 12 a flux detector 3 (see FIG. 1). Subsequently, the measurement value for the beam induced current I is corrected. The beam induced current I, which is directly measured at the sample 2, is a parametrization of the three dimensional absorption coefficient, the charge collection efficiency and the beam intensity. The beam intensity is a parameter of the beam source and is in principle known or it is determined using the flux detector 3. The three dimensional absorption coefficient is determined by analyzing the data of the detector 12 and hence, the charge collection efficiency can be reconstructed.

All named characteristics, including those taken from the drawings alone, and individual characteristics, which are disclosed in combination with other characteristics, are considered alone and in combination as important to the invention. Embodiments according to the invention can be fulfilled through individual characteristics or a combination of several characteristics. Features which are combined with the wording "in particular" or "especially" are to be treated as preferred embodiments.

LIST OF REFERENCES 2 sample
3 flux detector
4 probe beam 6 beam-direction
8 top surface
10 surface normal
12 detector
14 bottom surface
16 apparatus
18 rotation table
20 sample stage
22 sample holder
24 processing unit
26 measurement unit
28 contact pads
30 top layer
32 bottom layer
α angle of incidence
r angle of rotation
I beam induced current
V beam induced voltage
A sample stage rotation axis

The invention claimed is:

1. A tomographic method of determining a three-dimensional (3D) map of a charge collection efficiency in a volume of investigation of a sample, in which the sample has a charge carrier selecting structure, the method comprising the steps of:
electrically contacting the sample to allow a measurement of a beam induced current and/or voltage,
arranging the sample in a beam path of a probe beam, wherein the probe beam propagates in a beam-direction which defines an axis in a laboratory frame coordinate system,
scanning the volume of investigation with an analyzing spot of the probe beam and simultaneously measuring the beam induced current and/or voltage, wherein a position of the sample arranged on a sample stage is defined by coordinates z, y and r and a value of the beam induced current and/or voltage is determined for every position of the sample during the scanning action, wherein coordinate z corresponds to a point in a z-axis in the vertical direction, coordinate y corresponds to a point in a y-axis in the horizontal direction, and coordinate r corresponds to the sample stage rotation point in an axis along the direction of the z-axis and v-axis,
assigning every coordinate point (z, y, r) in the laboratory frame coordinate system, at which the analyzing spot of the probe beam hits the sample to a value of the beam induced current and/or voltage, which is measured for this point (z, y, r),
reconstructing the 3D map of the charge collection efficiency by processing the values of the beam induced current and/or voltage determined for the coordinates (z, y, r) in the laboratory frame coordinate system with a tomographic image reconstruction algorithm so as to determine the 3D map of the charge collection efficiency in a coordinate system of the sample.

2. The tomographic method according to claim 1, wherein the step of scanning includes: scanning the sample by performing a translational movement between the sample and the probe beam while keeping a spatial configuration between the sample and the beam-direction constant, and the method further includes:
determining a two-dimensional (2D) map of the beam induced current and/or voltage by assigning a respective one of the values of the measured beam induced current and/or voltage to the corresponding position, at which the beam induced current and/or voltage is measured,
changing the spatial configuration between the sample and the beam-direction by performing a rotational movement and repeating the steps of scanning and determining of the 2D-map for a plurality of different spatial configurations,
reconstructing the 3D map of the charge collection efficiency by processing the set of 2D-maps with a tomographic image reconstruction algorithm.

3. The tomographic method according to claim 2, wherein the step of reconstructing further includes the step of additionally including at least one parameter of a material of the sample when reconstructing the 3D map of the charge collection efficiency from the set of 2D-maps.

4. The tomographic method according to claim 1, further comprising the steps of:
arranging the sample on a sample stage, wherein the beam-direction defines an x-axis in depth direction of the laboratory frame coordinate system and the sample stage is configured to provide the translational movement of the sample in the z-axis in the vertical direction and the y-axis in the horizontal direction of the laboratory frame coordinate system and the sample stage is configured to provide a rotational movement of the sample about a sample stage rotation axis
scanning the volume of investigation in that the sample stage performs a translational movement of the sample in the z-direction and the y-direction of the laboratory frame coordinate system and in particular the rotational movement about the sample stage rotation axis.

5. The tomographic method according to claim 1, further comprising the steps of:
measuring the beam induced current and/or voltage and an additional measurement modality when scanning the volume of investigation,
correcting a measurement value for the beam induced current and/or voltage using a measurement value of the additional measurement modality, which is determined in a combined analysis,
wherein the additional measurement modality is one or more item selected from the following list: fluorescence, transmittance, reflectance, scattering, diffraction, excited optical luminescence, coherent diffraction imaging.

6. The tomographic method according to claim 1, further including the step of applying a variable bias voltage on the sample, wherein the bias voltage is changed during the step of scanning.

7. The tomographic method according to claim 1, wherein the probe beam is an X-ray beam, an ion beam, an electron beam or a laser beam.

8. The tomographic method according to claim 1, wherein the sample is a semiconductor device, a solar cell, a photon detector, an X-ray detector or a CCD-device and the charge collection efficiency is determined by measuring an output current and/or an output voltage of the solar cell, of the device or of the detector as the beam induced current and/or voltage.

9. An apparatus for determining a 3D map of a charge collection efficiency in a volume of investigation of a sample having a charge carrier selecting structure, the apparatus being configured to perform the method according to claim 1.

* * * * *